(12) United States Patent
Wang et al.

(10) Patent No.: US 9,899,334 B1
(45) Date of Patent: Feb. 20, 2018

(54) METHODS AND APPARATUS FOR ALIGNMENT MARKS (71) Applicant: Texas Instruments Incorporated, Dallas, TX (US)

(72) Inventors: Fuchao Wang, Plano, TX (US); Prakash Dalpatbhai Dev, Lubbock, TX (US); Dina Rodriguez, Richardson, TX (US); Dongping Zhang, McKinney, TX (US); Billy Alan Wofford, Sunnyvale, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/391,742

(22) Filed: Dec. 27, 2016

(51) Int. Cl.
H01L 23/544 (2006.01)
H01L 21/762 (2006.01)
H01L 21/306 (2006.01)
H01L 21/311 (2006.01)
H01L 21/02 (2006.01)
H01L 21/027 (2006.01)

(52) U.S. Cl.
CPC ........ H01L 23/544 (2013.01); H01L 21/0214 (2013.01); H01L 21/0274 (2013.01); H01L 21/02164 (2013.01); H01L 21/30604 (2013.01); H01L 21/31116 (2013.01); H01L 21/76202 (2013.01); H01L 2223/54426 (2013.01)

(58) Field of Classification Search
CPC ........ H01L 22/00; H01L 22/20; H01L 23/544
See application file for complete search history.

(56) References Cited

U.S. PATENT DOCUMENTS

2007/0218612 A1* 9/2007 Lin .................... H01L 21/28211
438/197

* cited by examiner

Primary Examiner — Jae Lee
(74) Attorney, Agent, or Firm — Tuenlap D. Chan; Charles A. Brill; Frank D. Cimino (57) ABSTRACT A method includes: growing a oxide layer on a topside of a semiconductor wafer using a local oxidation of silicon (LOCOS) process; forming a photoresist pattern with an alignment opening on the oxide layer; etching the oxide layer to form a trench in the oxide layer; etching an alignment mark trench into the exposed surface of the semiconductor wafer; depositing a dielectric layer that is one of a silicon nitride material or a silicon oxynitride material; performing an anisotropic plasma etch to remove the dielectric layer from horizontal surfaces on the oxide layer and the alignment mark trench and to form sidewalls from the dielectric layer on vertical sidewalls of the alignment mark trench; growing an alignment mark oxide layer on a bottom surface of the alignment trench; and etching and removing the oxide layer and the alignment mark oxide layer.

15 Claims, 8 Drawing Sheets

METHODS AND APPARATUS FOR ALIGNMENT MARKS

TECHNICAL FIELD

This relates generally to integrated circuit manufacturing, and more particularly to formation of alignment marks on integrated circuit wafers using local oxidation of silicon (LOCOS).

BACKGROUND

During integrated circuit manufacturing, photoresist patterns are formed on conductive or dielectric layers on a semiconductor wafer. After the patterns are formed a plasma or wet etch may be performed to transfer the photoresist pattern into the conductive or dielectric layers forming geometric structures such as interconnect leads or contact holes. When a new photoresist pattern is formed on the wafer it must be aligned to the geometries already existing on the wafer.

Alignment marks are used to align photoresist patterns with semiconductor wafers prior to performing deposition, to ensure the resulting features are aligned with prior features already present on the wafer. Alignment marks formed using LOCOS oxide features have sloped sidewalls, which can make alignment difficult or impossible as the alignment mark is not sufficiently sharp for machine vision tools to identify and align to.

Modern photolithography tools require the angle of the sidewalls on alignment mark trenches to be greater than about 70 degrees to avoid alignment errors. Alignment errors may occur when modern photolithography tools attempt to align to the sloped sidewalls formed by LOCOS. Improvements are therefore needed.

SUMMARY

In described examples, a method includes: growing a oxide layer on a topside of a semiconductor wafer using a local oxidation of silicon (LOCOS) process; forming a photoresist pattern with an alignment opening on the oxide layer; etching the oxide layer to form a trench in the oxide layer; etching an alignment mark trench into the exposed surface of the semiconductor wafer; depositing a dielectric layer that is one of a silicon nitride material or a silicon oxynitride material; performing an anisotropic plasma etch to remove the dielectric layer from horizontal surfaces on the oxide layer and the alignment mark trench and to form sidewalls from the dielectric layer on vertical sidewalls of the alignment mark trench; growing an alignment mark oxide layer on a bottom surface of the alignment trench; and etching and removing the oxide layer and the alignment mark oxide layer.

DETAILED DESCRIPTION OF EXAMPLE EMBODIMENTS

Corresponding numerals and symbols in the different figures generally refer to corresponding parts unless otherwise indicated. The figures are not necessarily drawn to scale.

Figure 1A:
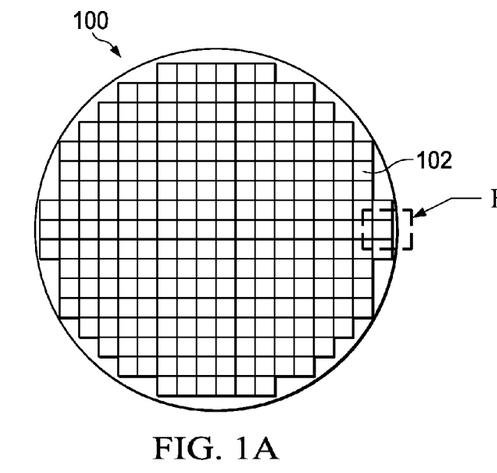
FIGS. 1A-1F illustrate in a series alignment of a reticle to an integrated circuit chip on a semiconductor wafer.

FIGS. 1A through 1F illustrate alignment of a photo reticle 110 to an integrated circuit chip 102 on a semiconductor wafer 100. FIG. 1A shows a semiconductor wafer 100 with integrated circuit chips 102.

Figures 1B, 1C, 1E, 1F:
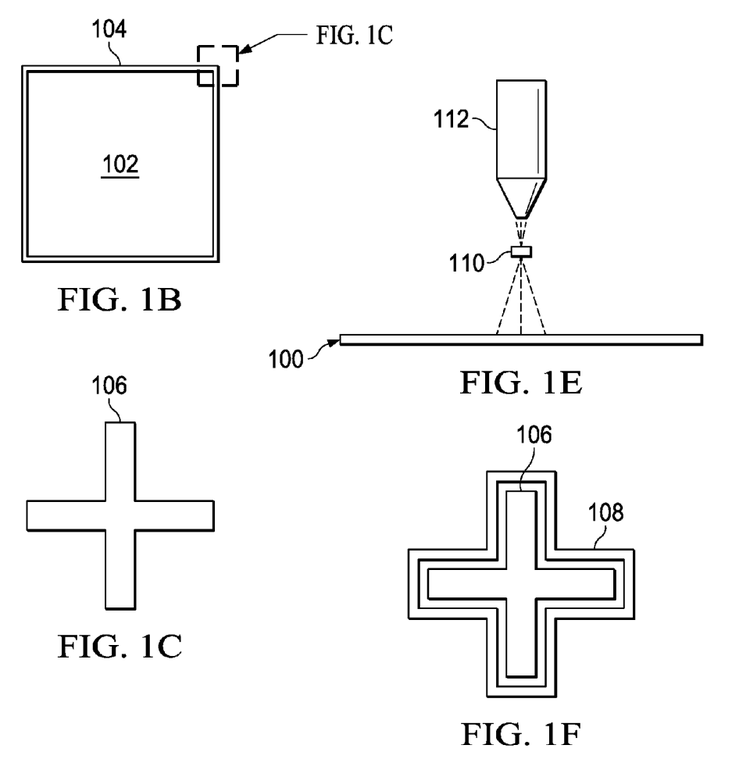

FIG. 1B shows an enlarged view of one of the integrated circuit chips 102. A scribe street 104 surrounds each integrated circuit chip 102. When the semiconductor wafer 100 processing is complete, the integrated circuit chips 102 are singulated by sawing them apart along the scribe streets 104. Alignment marks 106 are drawn in the corners of the scribe streets 104. A male alignment mark 106 is illustrated in FIG. 1C.

Figure 1D:
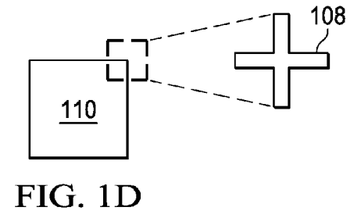

FIG. 1D shows a reticle 110 on which chrome patterns of the geometries to be formed in the next layer on the semiconductor are drawn. Alignment marks 108 are drawn in the corners of the reticle 110. A female alignment mark 108 is illustrated in FIG. 1D.

FIGS. 1E and 1F illustrate the alignment of the reticle 110 to the integrated circuit chip 102, followed by the printing of the chrome pattern on the reticle 110 onto the integrated circuit chip 102 on wafer 100.

In FIG. 1E the reticle 110 is positioned between the photolithographic printer 112 and the semiconductor wafer 100. The photolithographic printer 112 first aligns the female alignment mark 108 on the reticle 110 to the male alignment mark 106 in the scribe street 104 on the integrated circuit chip 102. FIG. 1F illustrates the aligned male 106 and female 108 alignment marks. After alignment, light from the photolithographic printer 112 projects and transfers the chrome patterns on the reticle 110 into a layer of photoresist (not shown, on the surface of wafer 100). This process is repeated for each of the integrated circuit chips 102 on the wafer 100.

Figure 2A:
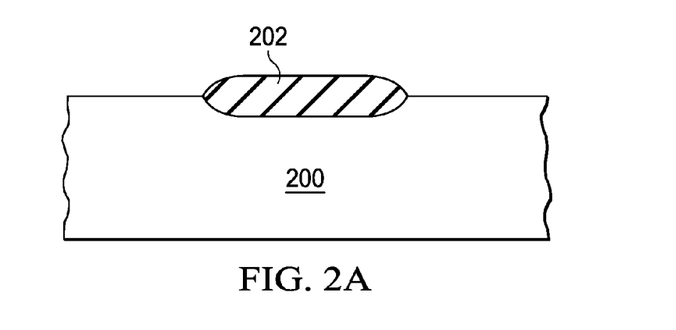
FIGS. 2A and 2B are cross sections of a wafer with an alignment mark formed using local oxidation of silicon.
Figure 3A:
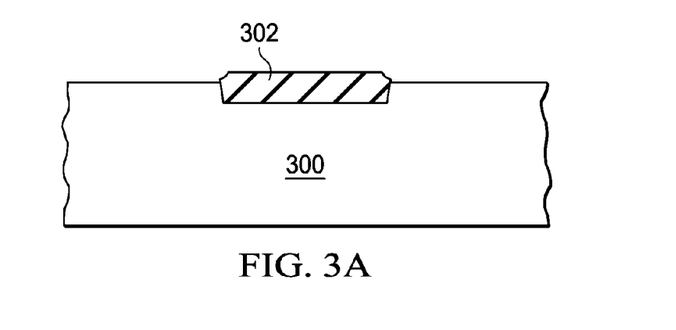
FIGS. 3A and 3B are cross sections of a wafer with an alignment mark formed using shallow trench isolation.

In FIGS. 2A and 3A oxide structures 202 and 302 are formed on the surface of silicon semiconductor wafers 200 and 300. These oxide structures, 202 and 302, are primarily used for isolation between transistors to be formed as part of integrated circuits that are manufactured on the semiconductor wafers. These oxide structures, 202 and 302, may also be used to form alignment marks. Alignment marks are areas on the semiconductor wafer that are either visible to an equipment operator or to automated equipment machine vision tools.

FIG. 2A shows an oxide structure 202 formed using local oxidation of silicon (LOCOS). FIG. 3A shows an oxide structure 302 formed using shallow trench isolation (STI). Although STI isolation is the predominant process presently used in advanced semiconductor manufacturing flows, LOCOS isolation is still used in some process flows, because LOCOS is less costly than STI. LOCOS is frequently used in manufacturing high voltage integrated circuits and in manufacturing analog integrated circuits.

Figure 2B:
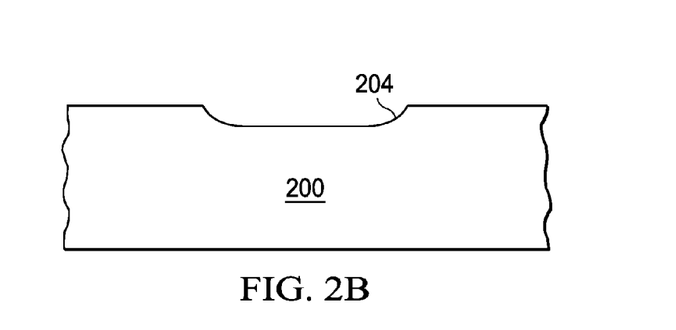
Figure 3B:
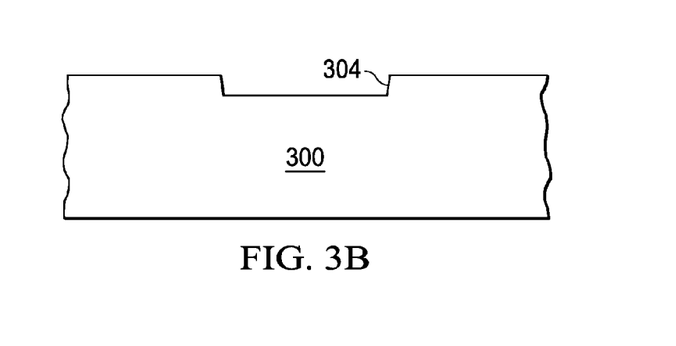

Before growing epitaxial silicon on the semiconductor wafers, the oxide structures, 202 and 302, are removed, forming alignment mark trenches. FIG. 2B and FIG. 3B show that the sidewalls 204 on the alignment trench formed using LOCOS are significantly more sloped than the sidewalls 304 on the alignment trench formed using STI.

Figure 4A:
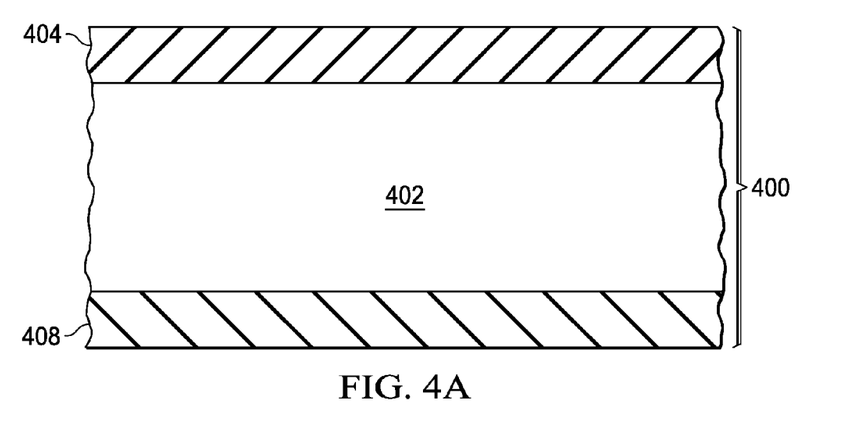
FIGS. 4A-4H are cross sections illustrating in a series an embodiment method for forming an alignment mark with substantially vertical sidewalls using a modified local oxidation of silicon process.
Figure 4B:
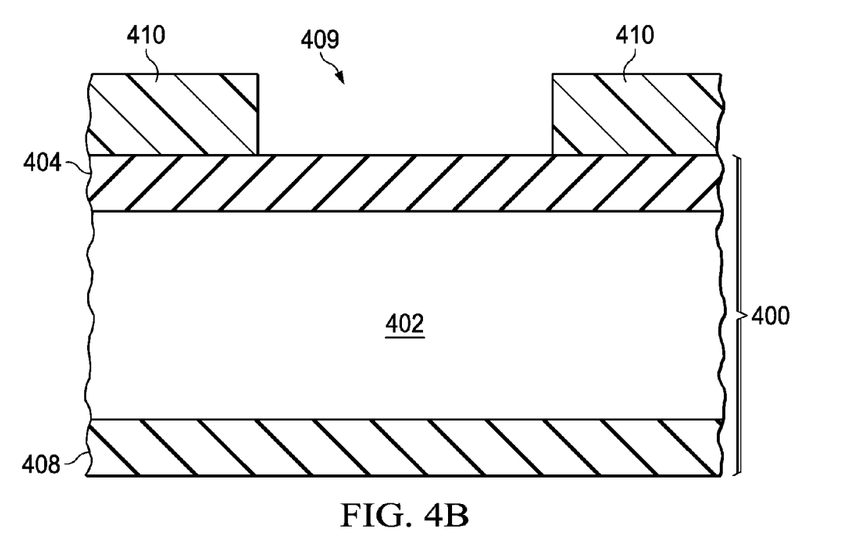
Figure 4C:
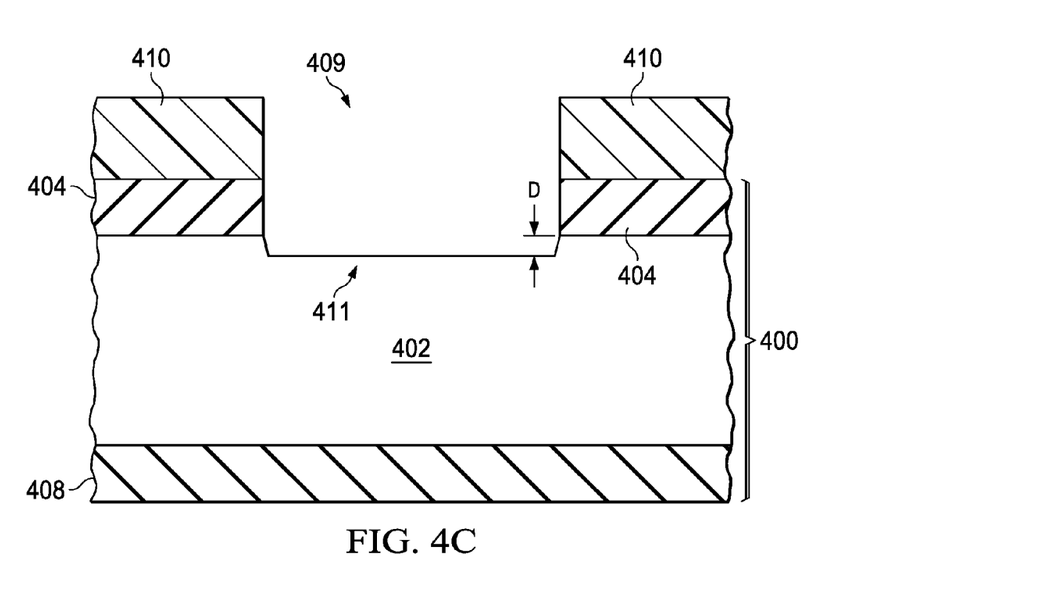
Figure 4D:
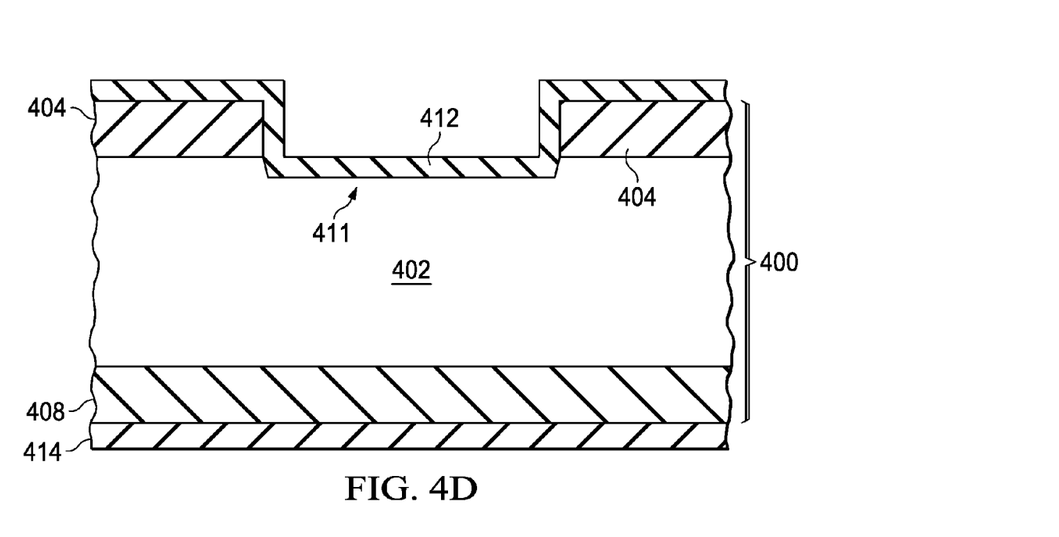
Figure 4E:
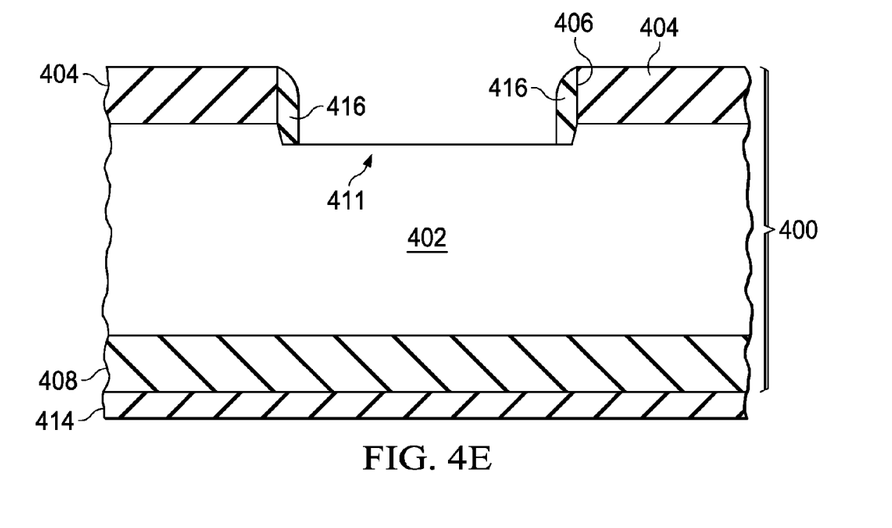
Figure 4F:
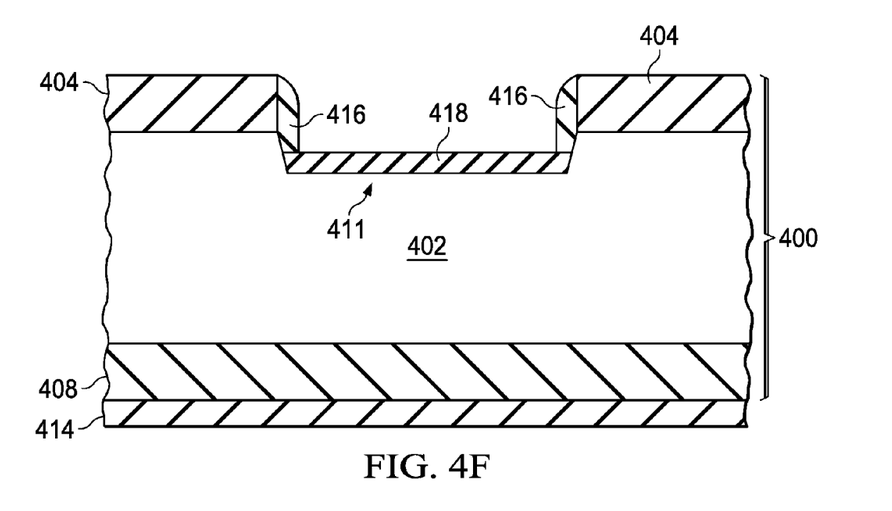
Figure 4G:
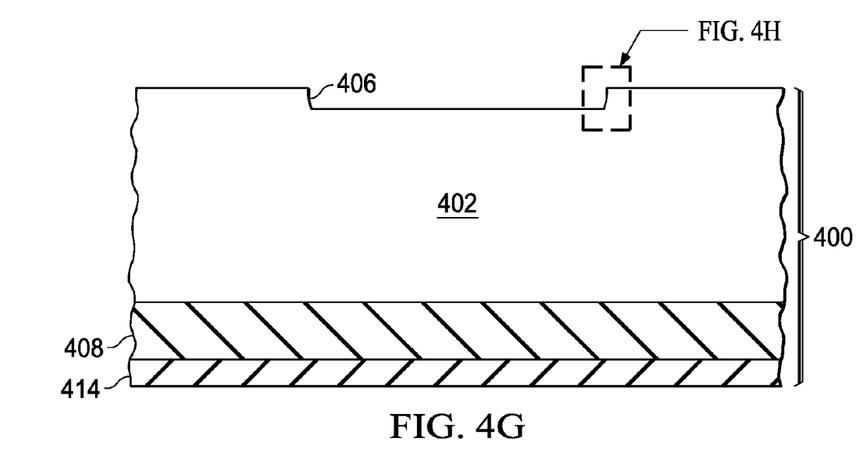
Figure 4H:
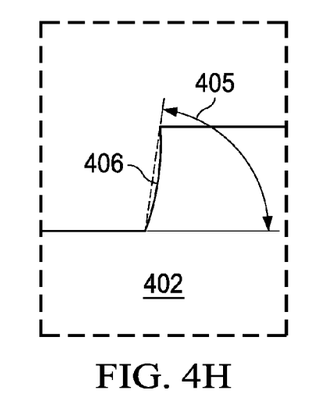

FIG. 4G shows a semiconductor wafer 400 with an alignment mark trench with substantially vertical sidewalls 406 formed using an embodiment for a modified local oxidation of silicon (LOCOS) process. Integrated circuits (ICs) will be formed on the semiconductor wafer using semiconductor processes including photolithography. Modern photolithography tools are able to reliably perform alignments to the alignment trench with the substantially vertical sidewalls 406 shown in FIG. 4G.

FIGS. 4A through 4H show a series of processing steps for a method embodiment for an integrated circuit on a semiconductor wafer made by forming an alignment mark trench, the alignment mark trench having substantially vertical sidewalls formed using a modified LOCOS process.

FIG. 4A shows a semiconductor wafer 400 with oxide layers, 404 and 408, grown on the topside and on the back side of the substrate 402. The topside oxide layer 404 has a thickness in the range of about 500 nm to about 900 nm. In an example implementation the topside oxide layer 404 has a thickness of 700 nm.

In FIG. 4B a photoresist pattern 410 is formed on the topside oxide layer 404, with an opening 409 where the alignment mark trench is to be formed.

In FIG. 4C, the topside oxide layer 404 is etched from the opening 409 in the photoresist pattern 408, exposing the surface of the semiconductor wafer 402. An alignment trench 411 is etched into the surface of the semiconductor wafer 402 with a depth D of between about 45 nm to about 120 nm. The depth D is a design parameter that requires some trade-off consideration. A deeper alignment trench is always more visible to the machine vision systems used in processing tools or to a human operator using a vision system to perform alignment. However, a greater alignment trench depth D can adversely affect planarity of the wafer for subsequent process steps. Accordingly, a depth D is determined that is sufficient for machine vision and visual alignment, but which is not so large as to adversely impact the planarity of the wafer or to adversely affect subsequent process steps, A preferred alignment mark trench 411 depth range is between about 65 nm and about 95 nm. In an example implementation the alignment mark trench 411 depth D is about 80 nm.

In FIG. 4D a top dielectric layer 412 and a bottom dielectric layer 414, both of which may include silicon nitride and/or silicon oxynitride, are deposited on the topside and backside of the semiconductor wafer 400. Typically the top and bottom dielectric layer 412 and 414 are deposited contemporaneously or simultaneously using low pressure chemical vapor deposition (LPCVD). The topside top dielectric layer 412 covers the horizontal and vertical surfaces of the topside oxide layer 404 and also covers the horizontal and vertical surfaces of the alignment trench 411. The bottom dielectric layer 414 also covers the oxide layer 408 on the backside of the substrate 402. These dielectric layers should have a good ability to block oxidation.

Referring now to FIG. 4E an anisotropic plasma etch is used to etch the top dielectric layer 412 from the horizontal surfaces of the silicon dioxide layer 404 and the alignment mark trench 411 on the topside of the wafer. Sidewalls 416, which include silicon nitride and/or silicon oxynitride, are formed on the vertical surfaces of the topside oxide layer 404 and the vertical sides 406 of the alignment mark trench 411. The anisotropic plasma etch is performed with a selectivity to the dielectric layer over oxide. For example, the anisotropic plasma etch can have a 1.5:1 selectivity ratio of the dielectric layer to the oxide to about a 2.5:1 selectivity ratio of the dielectric to the oxide. The anisotropic etch can be performed as a main etch with endpoint detection to end the etch, followed by an over-etch that is a timed etch.

As illustrated in FIG. 4F, an oxidation is then performed to grow an alignment mark oxide layer 418 on the exposed silicon surfaces in the alignment mark trench 411. The sidewalls 416 retard lateral oxidation on the sidewalls 406 of the alignment mark trench 406. The alignment mark oxide 418 may be grown with a thickness in the range of about 150 nm to 340 nm using either a wet (steam) or dry oxidation. A wet oxidation is usually preferred to reduce processing time. However, dry oxidation may also be used in the embodiments.

FIG. 4G shows the semiconductor wafer 400 after a wet etch is performed to remove the topside oxide layer 404 and also to remove the alignment mark oxide layer 418. During this oxide wet etch the sidewalls 416 are removed by lift off. Lift off is a unique processing step used to remove a sidewall spacer layer. In this example, the wet etch dissolves topside oxide layer 404, and also dissolves the oxide underneath the dielectric sidewalls 416. The sidewalls 416 then "lift" into the etchant and are washed away as particles. An oxide wet etch that may be used is COE (common oxide etch) which consists of 6% (49 wt % HF); 35% (40 wt % $NH_4F$); and 59% water by volume. The sidewalls 406 of the alignment mark trench formed using this embodiment modified LOCOS procedure are substantially more vertical than the sidewalls 204 (FIG. 2B) formed using a standard LOCOS procedure. This embodiment modified LOCOS process is optimized to produce sidewalls 406 on the alignment mark trench 411 that have an angle 405 of at least 70 degrees measured relative to the bottom horizontal surface of the alignment mark trench. The formation of the angle 405 that is sufficiently steep for use in pattern alignment significantly reduces wafer scrap due to photoresist pattern misalignment. Processing of the semiconductor wafer 400 continues to form epitaxial layers, for example, and to form integrated circuits on the semiconductor wafer.

Figure 5A:
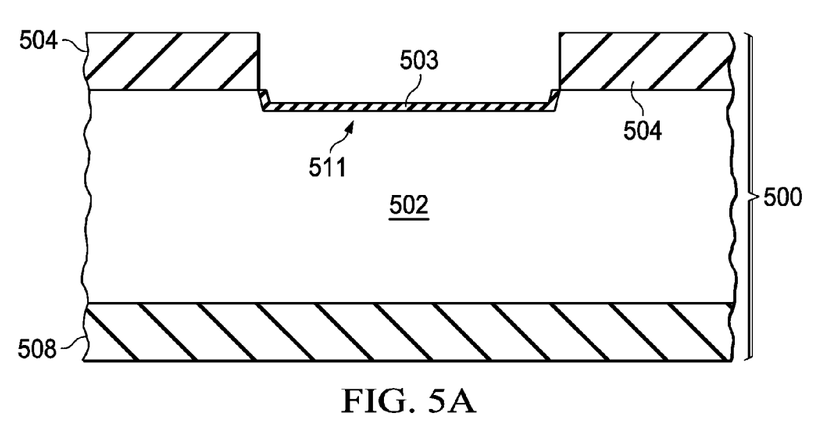
FIGS. 5A-5C are cross sections illustrating in a series another embodiment method for forming an alignment mark with substantially vertical sidewalls using a modified local oxidation of silicon process.
Figure 5B:
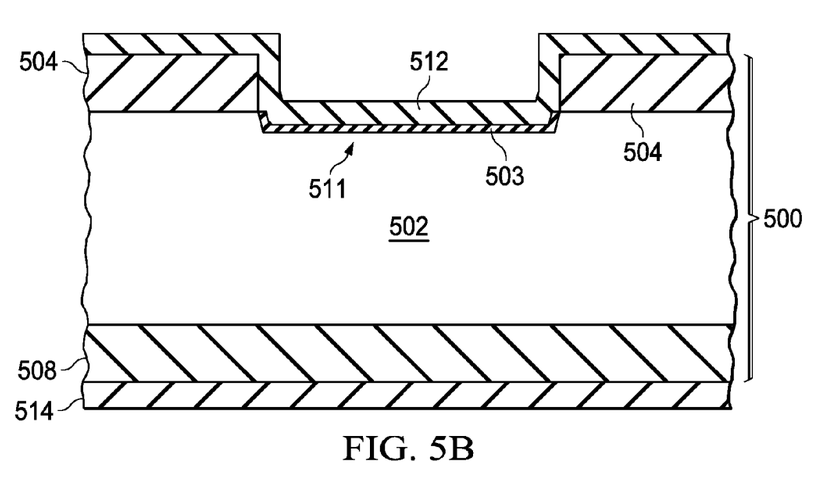
Figure 5C:
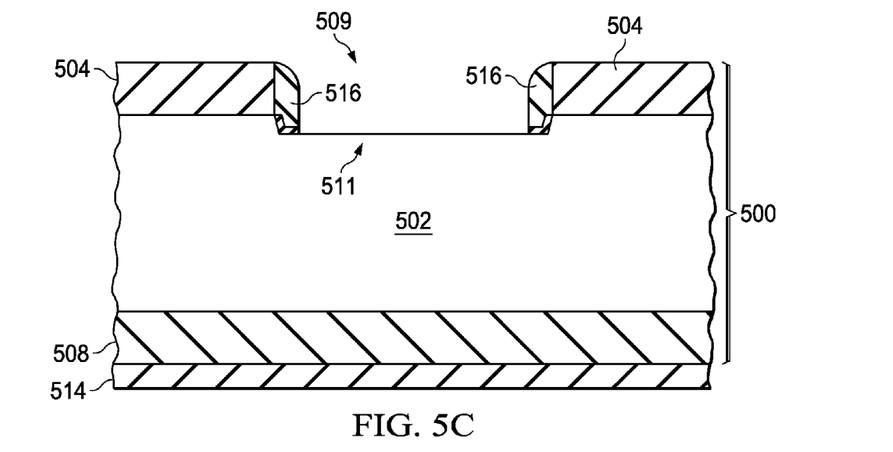

FIGS. 5A-5C are cross sections showing in a series another embodiment method for forming substantially vertical sidewalls on alignment mark trenches using LOCOS. It is sometimes desirable to form a thin oxide layer on exposed silicon surfaces prior to depositing a silicon nitride layer. Use of this thin oxide layer is especially desirable to prevent the formation of crystal defects in the substrate 502 if the semiconductor wafers 500 are subjected to a thermal process prior to removing the silicon nitride layer.

As shown in FIG. 5A, a thin oxide layer 503 may be grown thermally on the surface of the substrate 502 in the alignment mark trench 511, prior to deposition of the top and bottom dielectric layers which can be one of silicon nitride or silicon oxynitride. The thin oxide layer 503 may be grown with a thickness between about 6 nm and about 20 nm. In an example embodiment the thin oxide layer 503 is grown with a thickness of about 12 nm.

FIG. 5B shows top and bottom dielectric layers, 512 and 514, deposited on the top and on the backside surfaces the semiconductor wafer 500.

Referring to FIG. 5C, the top dielectric 512 layer 512 is etched using an anisotropic plasma etch to form the sidewalls 516 on the vertical surfaces of the alignment mark trench 511.

Additional processing as described above referring to FIGS. 4F and 4G completes the alignment mark trench 511.

Figure 6:
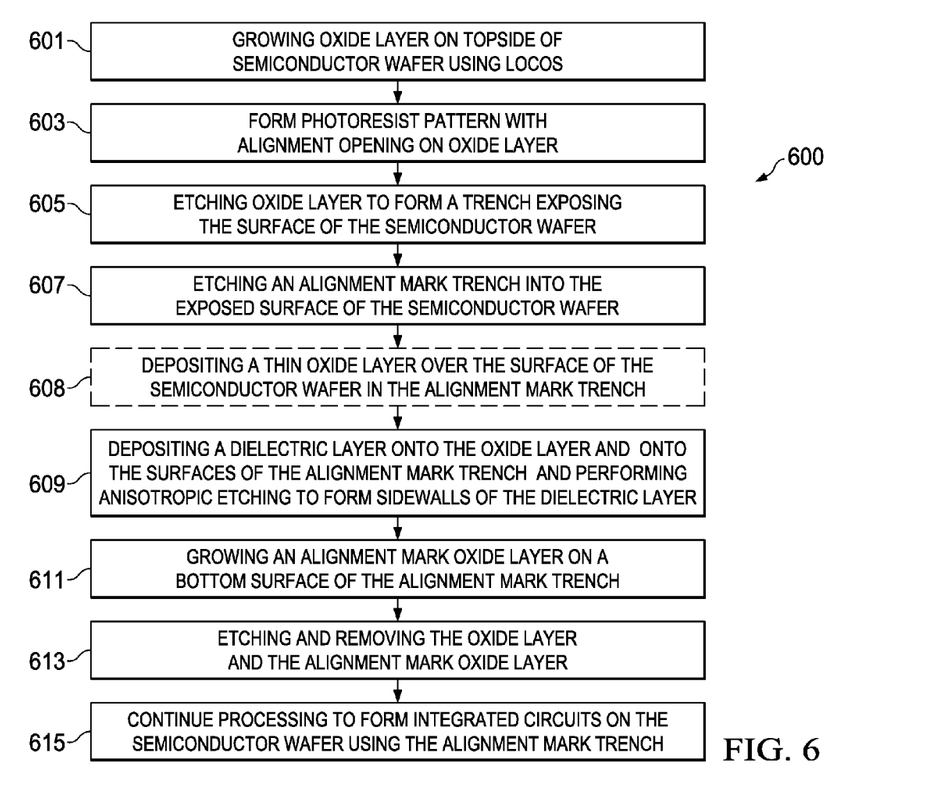
FIG. 6 is a flow diagram for an embodiment method for forming an alignment trench.

FIG. 6 is a flow diagram for a method embodiment 600. In FIG. 6, the method begins at step 601, where an oxide layer is grown on the topside of a semiconductor wafer using localized oxidation of silicon (LOCOS). At step 603, the method continues by forming a photoresist pattern with an alignment opening on the oxide layer formed in the prior step. In step 605, the method continues by etching the oxide layer to form a trench exposing the surface of the semiconductor wafer. At step 607, the method continues by etching an alignment mark trench into the exposed surface of the semiconductor wafer.

Step 608 is an optional step as is indicated by the dashed line around the box in FIG. 6. At step 608, a thin oxide layer is deposited or thermally grown over the surface of the semiconductor wafer and in the alignment mark trench. Use of a thin oxide layer prior to the deposition of the dielectric layer of silicon nitride or silicon oxynitride can reduce crystal defects that can otherwise occur.

Whether or not the optional step 608 is performed, the method continues to step 609 by depositing a dielectric layer onto the oxide layer, and onto the vertical and horizontal surfaces of the alignment mark trench. The method 600 continues at step 611, by growing an alignment mark oxide layer on a bottom surface of the alignment mark trench. At step 613, the method continues by completing the alignment mark trench by etching and removing the oxide layer and the alignment mark oxide layer. Following step 613, the method continues at step 615 with normal processing to form integrated circuits on the semiconductor wafer, including for example growing an epitaxial layer, using the alignment mark trench from step 613.

Use of the embodiments provides alignment mark trenches with sidewalls formed in a LOCOS process that are sufficiently vertical to enable correct alignment using human visual alignment or machine vision alignment in modern processing tools, and without alignment errors due to shallow sloped sidewalls as in prior approaches using LOCOS.

Modifications are possible in the described embodiments, and other embodiments are possible within the scope of the claims.

What is claimed is:

1. A method, comprising:
   growing an oxide layer on a topside of a semiconductor wafer using a local oxidation of silicon (LOCOS) process;
   forming a photoresist pattern with an alignment opening on the oxide layer;
   etching the oxide layer to form a trench in the oxide layer that exposes a surface of the semiconductor wafer;
   etching an alignment mark trench into the exposed surface of the semiconductor wafer;
   depositing a dielectric layer including one of a silicon nitride material or a silicon oxynitride material onto horizontal and vertical surfaces of the oxide layer and onto horizontal and vertical surfaces of the alignment mark trench;
   performing an anisotropic plasma etch to remove the dielectric layer from horizontal surfaces on the oxide layer and horizontal surfaces on the alignment mark trench and to form sidewalls from the dielectric layer that are selected from a silicon nitride material or a silicon oxynitride material on vertical sidewalls of the alignment mark trench;
   growing an alignment mark oxide layer on a bottom surface of the alignment mark trench; and
   wet etching and removing the oxide layer and the alignment mark oxide layer.

2. The method of claim 1, in which the etching includes one of a wet etch or a dry etch, and the removing includes one of the wet etch or the dry etch.

3. The method of claim 1, in which a depth of the alignment mark trench is in a range of about 45 nm to 120 nm.

4. The method of claim 1, in which a depth of the alignment mark trench is in a range of about 65 nm to 95 nm.

5. The method of claim 1, in which a thickness of the dielectric layer is in a range of about 120 nm to 160 nm.

6. The method of claim 1, in which the dielectric layer is a silicon nitride layer.

7. The method of claim 1, in which a thickness of the alignment mark oxide layer is in a range or about 150 nm to 340 nm.

8. The method of claim 1, further comprising removing the dielectric sidewalls during the step of etching the alignment mark oxide layer.

9. The method of claim 1, further comprising growing an additional oxide layer prior to depositing the dielectric layer.

10. A method, comprising:
    growing a first oxide layer on a topside of a semiconductor wafer;
    forming a photoresist pattern with an alignment opening on the first oxide layer;
    etching the first oxide layer exposed in the alignment opening to form a trench that exposes a surface of the semiconductor wafer;
    etching an alignment mark trench into the exposed surface of the semiconductor wafer;
    growing a second oxide layer;
    depositing a dielectric layer that is one of a silicon nitride material or a silicon oxynitride material onto horizontal and vertical surfaces of the first oxide layer, onto the horizontal surfaces of the second oxide layer, and onto horizontal and vertical surfaces of the alignment mark trench;
    performing an anisotropic plasma etch to remove the dielectric layer from horizontal surfaces on the topside of the semiconductor wafer and to form dielectric layer sidewalls on vertical sidewalls of the alignment mark trench;
    growing an alignment mark oxide layer; and
    wet etching and removing the alignment mark oxide layer and removing the first oxide layer and removing the second oxide layer.

11. The method of claim 10, in which a thickness of the second oxide layer is in a range of about 8 nm to 20 nm.

12. The method of claim 10, in which a depth of the alignment mark trench is in a range of about 45 nm to 120 nm.

13. The method of claim 10, in which a thickness of the dielectric layer is in a range of about 120 nm to 160 nm.

14. The method of claim 10, in which a thickness of the alignment mark oxide layer is in a range or about 150 nm to 340 nm.

15. The method of claim 10, and further including removing the dielectric layer sidewalls during the step of wet etching the alignment mark oxide.

* * * * *